(12) United States Patent
Lian et al.

(10) Patent No.: US 11,222,844 B2
(45) Date of Patent: Jan. 11, 2022

(54) VIA STRUCTURES FOR USE IN SEMICONDUCTOR DEVICES

(71) Applicant: GLOBALFOUNDRIES U.S. INC., Santa Clara, CA (US)

(72) Inventors: Jun Lian, Malta, NY (US); Sipeng Gu, New York, NY (US); Haiting Wang, Malta, NY (US); Yanping Shen, Malta, NY (US)

(73) Assignee: GLOBALFOUNDRIES U.S. Inc., Santa Clara, CA (US)

(*) Notice: Subject to any disclaimer, the term of this patent is extended or adjusted under 35 U.S.C. 154(b) by 0 days.

(21) Appl. No.: 16/899,543

(22) Filed: Jun. 11, 2020

(65) Prior Publication Data
US 2021/0391250 A1    Dec. 16, 2021

(51) Int. Cl.
*H01L 23/522* (2006.01)
*H01L 43/12* (2006.01)
*H01L 43/02* (2006.01)
*H01L 45/00* (2006.01)
*H01L 23/528* (2006.01)
*H01L 23/532* (2006.01)
*H01L 27/11585* (2017.01)

(52) U.S. Cl.
CPC ........ *H01L 23/5226* (2013.01); *H01L 23/528* (2013.01); *H01L 23/5329* (2013.01); *H01L 27/11585* (2013.01); *H01L 43/02* (2013.01); *H01L 43/12* (2013.01); *H01L 45/12* (2013.01); *H01L 45/16* (2013.01)

(58) Field of Classification Search
CPC .............. H01L 23/5226; H01L 23/528; H01L 23/5329; H01L 27/11585; H01L 43/02; H01L 43/12; H01L 45/12; H01L 45/16
USPC ......................................................... 257/774
See application file for complete search history.

(56) References Cited

U.S. PATENT DOCUMENTS

| 8,558,334 B2* | 10/2013 | Ueki | ................ H01L 43/12 |
| | | | 257/421 |
| 2004/0137714 A1* | 7/2004 | Friedemann | ........ H01L 21/2855 |
| | | | 438/627 |
| 2007/0172964 A1 | 7/2007 | Yen et al. | |
| 2012/0228728 A1* | 9/2012 | Ueki | ................ H01L 43/12 |
| | | | 257/421 |
| 2014/0131651 A1 | 5/2014 | Tu et al. | |
| 2015/0263069 A1* | 9/2015 | Jo | ................ H01L 45/145 |
| | | | 365/148 |

* cited by examiner

*Primary Examiner* — Tu-Tu V Ho
(74) *Attorney, Agent, or Firm* — Anthony Canale (57) ABSTRACT

The present disclosure relates generally to structures in semiconductor devices and methods of forming the same. The present disclosure provides a semiconductor device including a first device region and a second device region. The first device region includes a first metal layer, a first via structure over the first metal layer, a second via structure over the first via structure, and a second metal layer over the second via structure. The first via structure and the second via structure electrically couple the second metal layer to the first metal layer. The second device region includes a third metal layer, a contact structure over the third metal layer, a memory cell structure over the contact structure, and a fourth metal layer over the memory cell structure. The first via structure and the contact structure are made of the same material.

20 Claims, 5 Drawing Sheets

VIA STRUCTURES FOR USE IN SEMICONDUCTOR DEVICES

FIELD OF THE INVENTION

The disclosed subject matter relates generally to structures in semiconductor devices and methods of forming the same. More particularly, the present disclosure relates to via structures for use in semiconductor devices, such as a memory device.

BACKGROUND

The semiconductor industry's drive for higher density, higher performance, lower-cost devices and the implementation of nanometer-scale process nodes have resulted in the development of various integrated circuit (IC) chips with increasingly smaller and more complex circuits. In the course of semiconductor evolution, the number of interconnected devices per unit of area has increased as the size of the smallest component that can be reliably created has decreased. An IC chip can include numerous device components, such as, but not limited to, memory cells, transistors, capacitors, and optical/photonic components.

The scaling down of devices within an IC chip has been met with challenges. As the dimensions of such devices are being reduced and the density of fabricated devices in a given region is being increased, numerous space and layout constraints have surfaced. For example, the formation of undesirable voids may occur during the fabrication of features with small aspect ratios (i.e., small width to height ratios). This is because features with small aspect ratios may typically have narrow width and elongated height dimensions, which may increase defect occurrences during the etching and deposition processes to fabricate them. Formation of these undesirable voids may increase the electrical resistance of the device components, thereby reducing the electrical performance and the reliability of the overall IC chip.

Therefore, there is a need to provide structures and semiconductor devices that can overcome, or at least ameliorate, one or more of the disadvantages as described above.

SUMMARY

In an aspect of the present disclosure, there is provided a semiconductor device including a first device region and a second device region. The first device region includes a first metal layer, a first via structure over the first metal layer, a second via structure over the first via structure, a second metal layer over the second via structure, in which the first via structure and the second via structure electrically couple the second metal layer to the first metal layer. The second device region includes a third metal layer, a contact structure over the third metal layer, a memory cell structure over the contact structure, and a fourth metal layer over the memory cell structure. The first via structure and the contact structure are made of the same material.

In another aspect of the present disclosure, there is provided a method of forming a semiconductor device by forming a first metal layer and a third metal layer in a dielectric region, in which the first metal layer is located in a first device region, and the third metal layer is located in a second device region. The method also includes forming a dielectric layer on the dielectric region, patterning openings in the dielectric layer, filling the openings with a conductive material to form a first via structure over the first metal layer and a contact structure over the third metal layer, and forming a memory cell structure over the contact structure. The method further includes forming a second via structure over the first via structure and a second metal layer on the second via structure, in which the first via structure and the second via structure electrically couple the second metal layer to the first metal layer, and forming a fourth metal layer over the memory cell structure.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
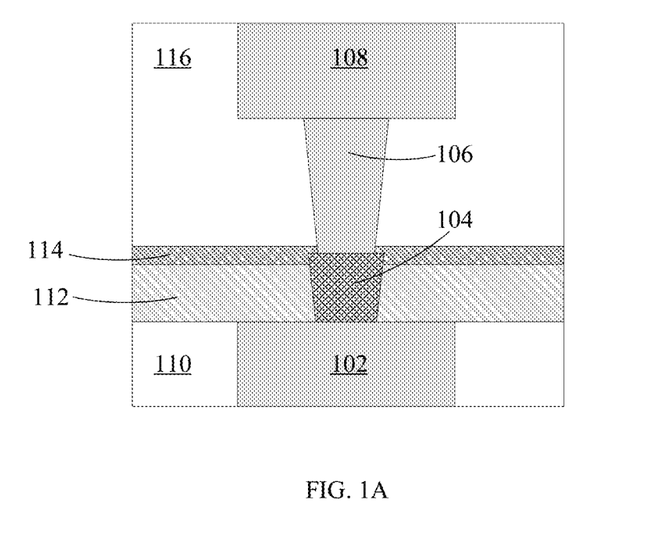
FIG. 1A and FIG. 1B are cross-sectional views of embodiments of a structure for use in a semiconductor device, in accordance with the present disclosure.
Figure 1B:
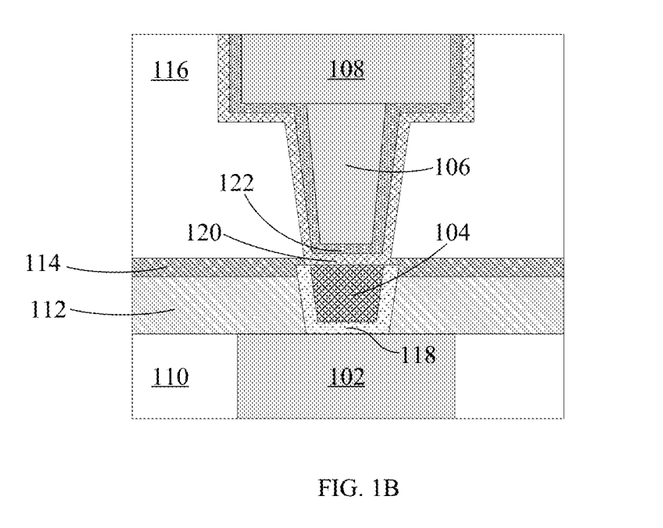

Referring to FIG. 1A and FIG. 1B, there is provided a structure having a first metal layer 102, a first via structure 104 over the first metal layer 102, a second via structure 106 over the first via structure 104, and a second metal layer 108 on the second via structure 106. The first via structure 104 and the second via structure 106 may electrically couple the second metal layer 108 to the first metal layer 102, for example, by providing a conductive path for current flow between the first metal layer 102 and the second metal layer 108.

Advantageously, by configuring the first via structure 104 and the second via structure 106 between the first metal layer 102 and the second metal layer 108, the width to height ratio of each of the first via structure 104 and the second via structure 106 may be increased at a given separation distance between the first metal layer 102 and the second metal layer 108. The increased width to height ratio may enable complete filling of materials during deposition processes to form the structures. Additionally, the inclusion of the first via structure 104 may enable the formation of a second via structure 106 having substantially vertical or chamferless sidewalls.

The first metal layer 102 may be formed in a first dielectric region 110. The first dielectric region 110 may be an inter-metal dielectric (IMD) layer or a "metallization level" that embeds various interconnect features, such as the first metal layer 102. Examples of dielectric material in the first dielectric region 110 may include, but not limited to, silicon dioxide, tetraethyl orthosilicate (TEOS), or a material having a chemical composition of $SiC_xO_yH_z$, wherein x, y, and z are in stoichiometric ratio.

The first via structure 104 may be formed in a dielectric layer 112. The dielectric layer 112 may be disposed upon the first dielectric region 110 and may function as an etch stop layer. Examples of dielectric material in the dielectric layer 112 may include, but not limited to, silicon nitride (SiN), or Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75.

The second via structure 106 and the second metal layer 108 may be formed in a second dielectric region 116. In some embodiments, the second metal layer 108 may be integrally formed with the second via structure 106. The second dielectric region 116 is disposed over the dielectric layer 112. The second dielectric region 116 may also be an inter-metal dielectric (IMD) layer or a "metallization level" that embeds various interconnect features, such as the second via structure 106 and the second metal layer 108. Examples of dielectric material in the second dielectric region 116 may include, but not limited to, silicon dioxide, tetraethyl orthosilicate (TEOS), or a material having a chemical composition of $SiC_xO_yH_z$, wherein x, y, and z are in stoichiometric ratio. Also shown in the representative embodiments, a passivation liner 114 may be added between the second dielectric region 116 and the dielectric layer 112.

In some embodiments, the first via structure 104 may be shorter than the second via structure 106. The second via structure 106 and the first via structure 104 may be made of conductive materials, such as tungsten (W), ruthenium (Ru), cobalt (Co), copper (Cu), titanium (Ti), nickel (Ni), platinum (Pt), aluminum (Al), or an alloy thereof. In an embodiment, the second via structure 106 and the first via structure 104 are made of different materials. In an alternative embodiment, the second via structure 106 and the first via structure 104 are made of the same material.

In the embodiment shown in FIG. 1A, the second via structure 106 may be disposed upon or disposed directly on the first via structure 104. The first via structure 104 may also be disposed upon or disposed directly on the first metal layer 102. Alternatively, in the embodiment shown in FIG. 1B, the structure may include conductive barrier liners 118, 120, 122 between the second via structure 106 and the first via structure 104, as well as between the first via structure 104 and the first metal layer 102. Exemplary materials for the conductive barrier liners 118, 120, 122 may include, but not limited to, titanium, titanium nitride, tantalum, or tantalum nitride.

As shown, a first conductive barrier liner 118 may be disposed between the first metal layer 102 and the first via structure 104. The first conductive liner 118 may surround lateral surfaces and a lower surface of the first via structure 104. The first conductive liner 118 may function to prevent or reduce the diffusion of atoms between the first metal layer 102 and the first via structure 104, whilst allowing electrical conduction between the first metal layer 102 and the first via structure 104.

At least one conductive barrier liner, such as a second conductive barrier liner 120 and a third conductive barrier liner 122, may be disposed between the second via structure 106 and the first via structure 104. As shown, the second conductive barrier liner 120 may be disposed upon the first via structure 104 while the third conductive barrier liner 122 may be disposed upon the second conductive barrier liner 120. The second conductive barrier liner 120 and the third conductive barrier liner 122 may surround lateral and lower surfaces of the second via structure 106. The second conductive barrier liner 120 and the third conductive barrier liner 122 may prevent or reduce the diffusion of atoms between the second via structure 106 and the first via structure 104, whilst allowing electrical conduction between the second via structure 106 and the first via structure 104.

Figure 2A:
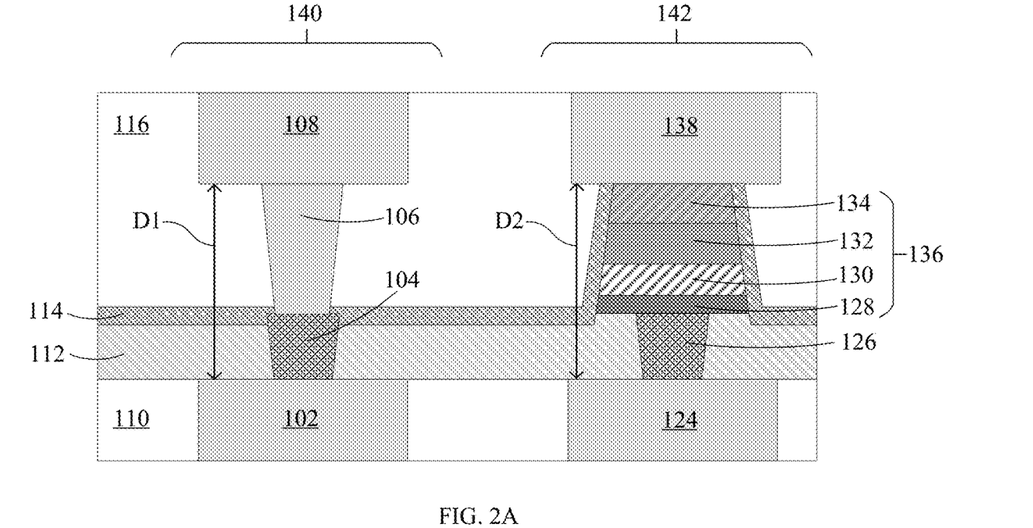
FIG. 2A and FIG. 2B are cross-sectional views of embodiments of a semiconductor device, in accordance with the present disclosure.

Referring to FIG. 2A, a cross-sectional view of an exemplary semiconductor device is shown. The device may include a first device region 140 and a second device region 142. The first device region 140 may be a logic region and includes a first metal layer 102, a first via structure 104 over the first metal layer 102, a second via structure 106 over the first via structure 104, a second metal layer 108 over the second via structure 106. The first via structure 104 and the second via structure 106 may provide a conductive path for current flow to electrically couple the second metal layer 108 with the first metal layer 102.

The second device region 142 may be a memory region and includes a third metal layer 124, a contact structure 126 over the third metal layer 124, a memory cell structure 136 over the contact structure 126, and a fourth metal layer 138 over the memory cell structure 136. The first via structure 104 and the contact structure 126 may have the same height. In an embodiment, the second via structure 106 may be formed in the first device region 140 (e.g., a logic region) only and may be absent from the second device region 142 (e.g., a memory region).

In some embodiments, the memory cell structure 136 may be configured as a resistive memory device. Examples of a resistive memory device may include, but not limited to, oxide random-access memory (OxRAM) and conductive bridge random-access memory (CBRAM). Alternatively, in other embodiments (not shown), the memory cell structure 136 may also be configured as a magneto-resistive random access memory (MRAM) device, or a ferro-electric random access memory (FeRAM) device.

In the representative embodiment, for example, the memory cell structure 136 is illustrated as a resistive memory device and may be configured to include a resistive element 130 configured between a pair of electrodes, such as a first electrode 128 and a second electrode 132. A capping layer 134 may be arranged upon the second electrode 132. The resistive element 130 may be configured to have a switchable resistance in response to a change in voltage between the first electrode 128 and the second electrode 132. The resistive element 130 may exhibit resistive changing properties characterized by different resistive states of the material forming this layer. These resistive states (e.g., a high resistive state or a low resistive state) may be used to represent one or more bits of information.

Examples of the material for the resistive element 130 may include carbon polymers, perovskites, metal oxides or nitrides. Some examples of metal oxides may include lanthanide oxides, tungsten oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. In some embodiments, metal oxides with a bandgap greater than 3 eV may be used. Examples of such oxides may include titanium oxide, tungsten oxide, niobium oxide, nickel oxide, zinc oxide, lanthanide oxides, hafnium oxide, aluminum oxide, tantalum oxide, zirconium oxide, and yttrium oxide.

The first electrode 128 and the second electrode 132 may include a conductive material such as, but not limited to, titanium, titanium nitride, tantalum, tantalum nitride, and platinum. The capping layer 134 may serve as a protective layer for the second electrode 132 and may include a metallic compound capable of conducting electricity. Some examples of metallic compounds for the capping layer 134 may include, but not limited to, titanium, aluminum, tantalum, a stack thereof, a conductive oxide thereof, a conductive nitride thereof, an alloy thereof, and a combination thereof.

Referring again to FIG. 2A, the semiconductor device may include a first dielectric region 110. The first dielectric region 110 may include the first metal layer 102 and the third metal layer 124. A dielectric layer 112 may be disposed upon the first dielectric region 110, where the first via structure 104 of the first device region 140 and the contact structure 126 of the second device region 142 are formed therein. In an embodiment, the first via structure 104 and the contact structure 126 are made of the same material.

A passivation liner 114 may be disposed upon the dielectric layer 112 and extends along sidewalls of the memory cell structure 136. The passivation liner 114 may protect the structural integrity and the material composition of the memory cell structure 136. A second dielectric region 116 may be disposed over the first dielectric region 110. The second via structure 106, the memory cell structure 136, the second metal layer 108 and the fourth metal layer 138 may be embedded in the second dielectric region 116.

Also shown in FIG. 2A, the first metal layer 102 may be separated from the second metal layer 108 by a distance D1, while the third metal layer 124 may be separated from the fourth metal layer 138 by a distance D2. The second metal layer 108 may be substantially coplanar with the fourth metal layer 138 such that the separation distance D1 between the second metal layer 108 and the first metal layer 102 within the first device region 140 may be substantially the same as the separation distance D2 between the third metal layer 124 and the fourth metal layer 138 within the second device region 142.

Figure 2B:
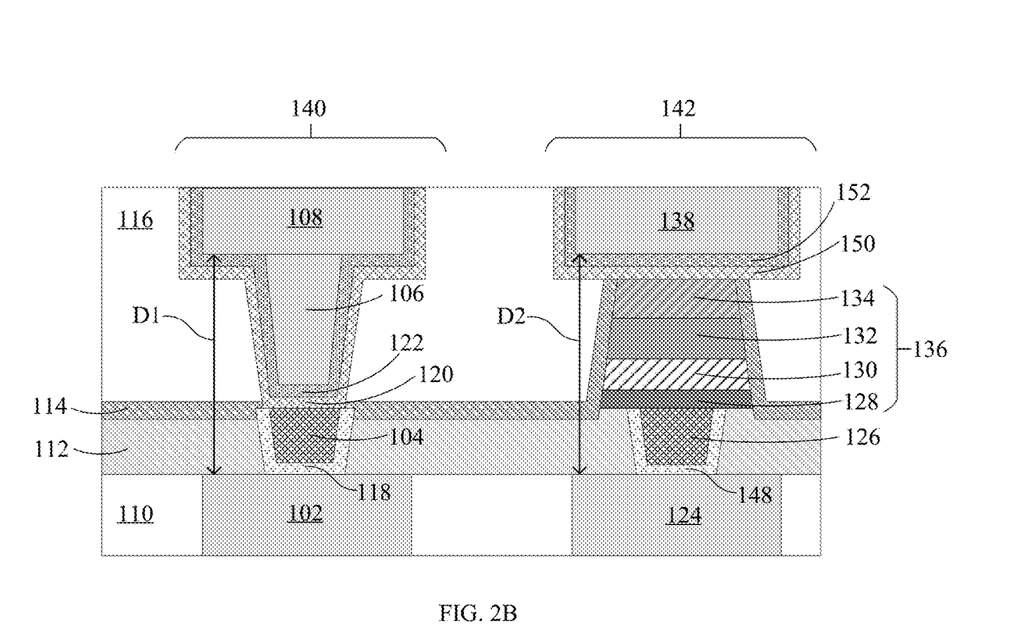

Referring to FIG. 2B, a cross-sectional view of another exemplary semiconductor device is shown. The embodiment shown in FIG. 2B is similar to the embodiment shown in FIG. 2A except that in FIG. 2B, the device also includes conductive barrier liners 118, 120, 122, 148, 150, 152. Exemplary materials for the conductive barrier liners 118, 120, 122, 148, 150, 152 may include, but not limited to, titanium, titanium nitride, tantalum, or tantalum nitride.

As shown, the conductive barrier liners 118 and 148 are disposed between the first via structure 104 and the first metal layer 102, and between the contact structure 126 and the third metal layer 124, respectively. In the first device region 140, the conductive barrier liners 120, 122 are disposed between the second via structure 106 and the first via structure 104. In the second device region 142, the conductive barrier liners 152, 150 are disposed between the fourth metal layer 138 and the memory cell structure 136.

Although not shown, the first metal layer 102, the second metal layer 108, the third metal layer 124, and the fourth metal layer 138 may be connected to various active components in the semiconductor device and may be configured to provide routing of electrical signals to and from the various active components. Example of active components may include diodes (e.g., single-photon avalanche diode) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bipolar junction transistors (BJT).

FIGS. 3 through 8 show a set of steps that may be used to create the semiconductor devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Figure 3:
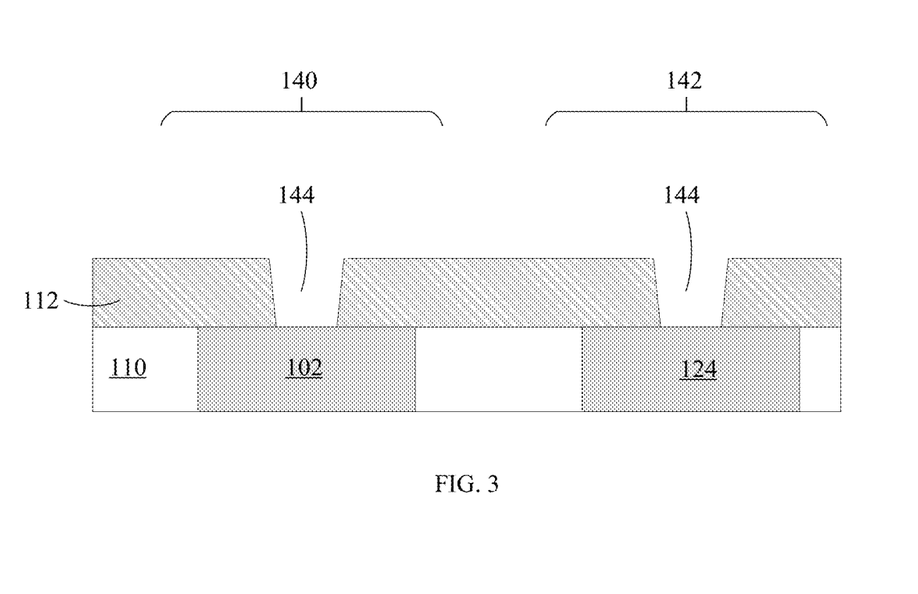
FIG. 3 to FIG. 8 are cross-sectional views depicting various stages of forming a semiconductor device, in accordance with embodiments of the present disclosure.

Referring to FIG. 3, a device structure for use in fabricating the semiconductor devices of the present disclosure is shown. The device structure may have a first device region 140 and a second device region 142. The device structure provides a first dielectric region 110 having a first metal layer 102 and a third metal layer 124. The first metal layer 102 may be located in the first device region 140 and the third metal layer 124 may be located in the second device region 142. A dielectric layer 112 may be provided upon the first dielectric region 110. The dielectric layer 112 may be patterned to define openings 144 in the dielectric layer 112 using the patterning techniques described herein. The openings 144 may expose the underlying first metal layer 102 and the third metal layer 124.

Figure 4:
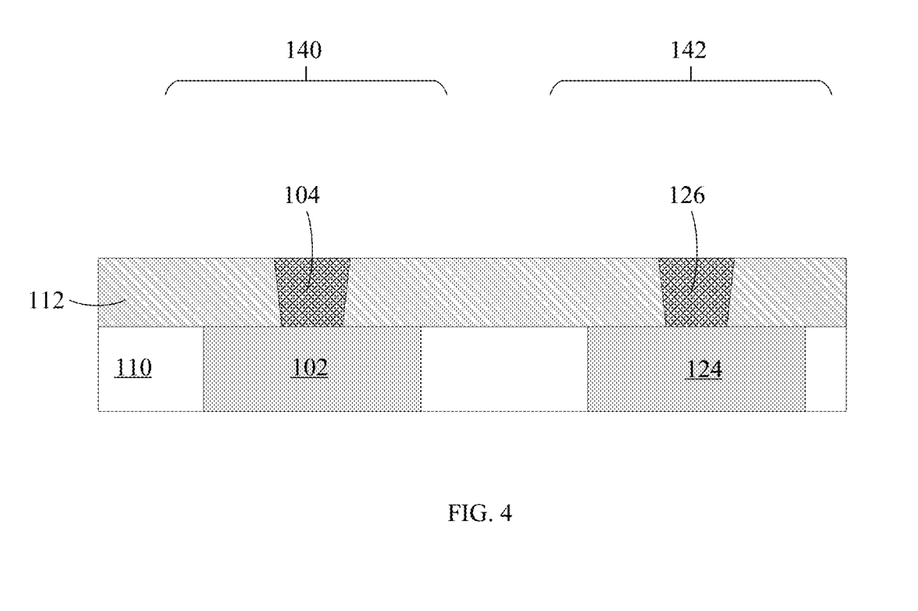

Referring to FIG. 4, the openings 144 are filled with a conductive material to form a first via structure 104 over the first metal layer 102. Additionally, the filling of the openings 144 with the conductive material may also include forming a contact structure 126 over the third metal layer 124. The filling of the openings 144 may be performed using the deposition techniques described herein. The first via structure 104 and the contact structure 126 may be formed in the same dielectric layer, e.g., dielectric layer 112, and may be formed with the same material. Forming the first via structure 104 and the contact structure 126 in the same dielectric layer and with the same material may offer an advantage of elegant engineering control of etching and deposition process parameters, and can also increase the patterning density at a given region of a device.

To form the embodiments shown in FIG. 1A and FIG. 2A, the conductive material may be deposited directly on the first metal layer 102 and the third metal layer 124. Alternatively, to form the embodiments shown in FIG. 1B and FIG. 2B, a conductive barrier liner (not shown) may be deposited in the openings 144 before the deposition of the conductive material to form the first via structure 104 and the contact structure 126. A chemical mechanical polishing (CMP) step may be performed thereafter to planarize the upper surfaces of the first via structure 104 and the contact structure 126.

Figure 5:
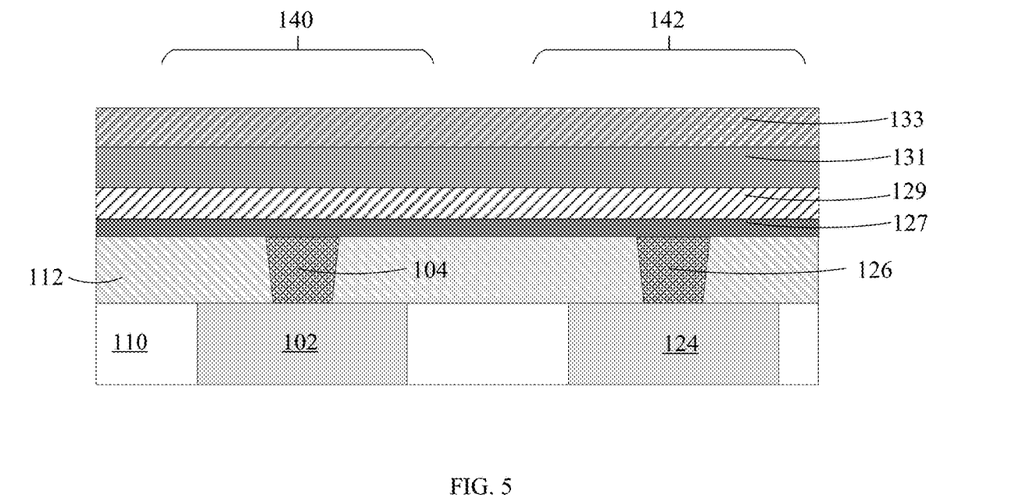
Figure 6:
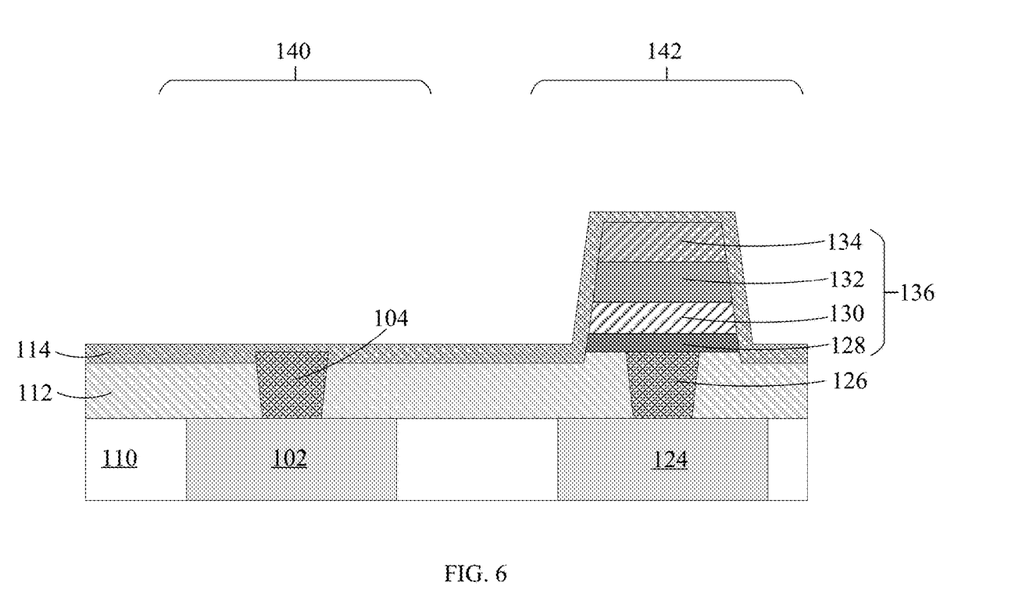

FIG. 5 and FIG. 6 illustrate the formation of a memory cell structure 136 in the second device region 142. As shown in FIG. 5, a first electrode layer 127 may be deposited to cover the dielectric layer 112, the first via structure 104, and the contact structure 126. A resistive element layer 129 may be deposited on the first electrode layer 127, and a second electrode layer 131 may be subsequently deposited on the resistive element layer 129. Thereafter, a metallic compound layer 133 may be deposited on the second electrode layer 131. Several deposition steps using the deposition techniques as described herein may be performed at this stage.

As shown in FIG. 6, a memory cell structure 136 may be formed in the second device region 142 by patterning the first electrode layer 127, the resistive element layer 129, the second electrode layer 131, and the metallic compound layer 133 using the patterning techniques described herein. The patterning of the layers may include, for example, an etching process that may be stopped using the dielectric layer 112 as an "etch stop" material. The memory cell structure 136 may include a first electrode 128 disposed upon the contact structure 126, a resistive element 130 disposed upon the first electrode 128, a second electrode 132 disposed upon the resistive element 130, and a capping layer 134 disposed upon the second electrode 132. The patterning process may also expose the first via structure 104 in the first device region 140. A passivation liner 114 may be deposited on the exposed first via structure 104 and also surrounds the memory cell structure 136.

Figure 7:
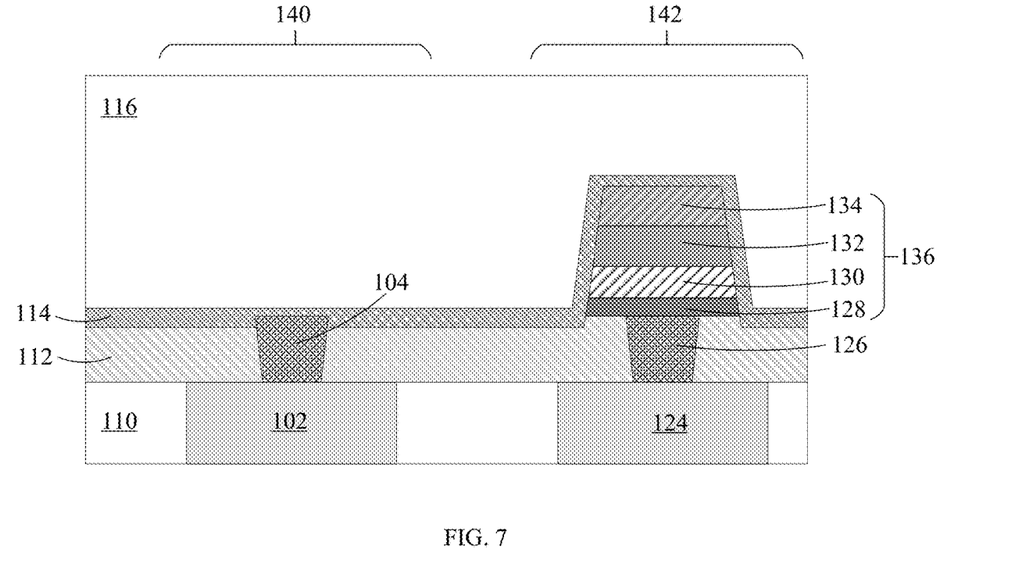

Referring to FIG. 7, a second dielectric region 116 may be formed over the first via structure 104 and the memory cell structure 136. The second dielectric region 116 may be formed by the deposition of a dielectric material on the passivation liner 114 using the deposition techniques described herein.

Figure 8:
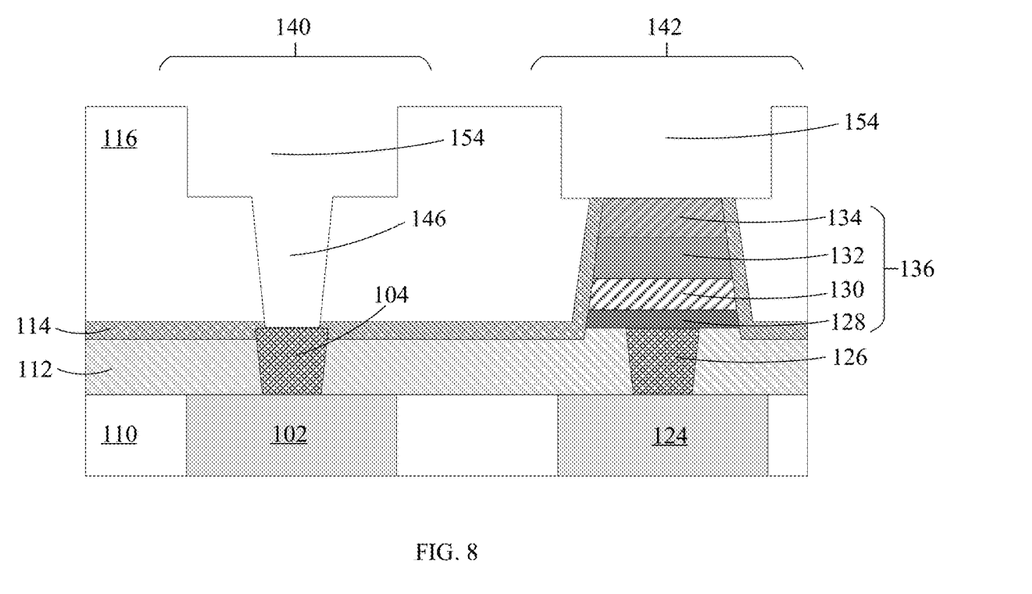

Referring to FIG. 8, the deposited dielectric material may be patterned to define a via opening 146 and trenches 154 in the second dielectric region 116. As shown, in the first device region 140, a via opening 146 may be formed over the first via structure 104 and a trench 154 may be formed over the via opening 146. The trench 154 and the via opening 146 in the first device region 140 may be contiguous with each other. In the second device region 142, a trench 154 may be formed over the memory cell structure 136. Several patterning steps using the patterning techniques described herein may be performed at this stage.

The via opening 146 and the trenches 154 may be subsequently filled with a conductive material using the deposition techniques described herein. For example, the filling of the via opening 146 and the trenches 154 with the conductive material forms the respective second via structure 106, the second metal layer 108, and the fourth metal layer 138, as shown in FIGS. 1A through 2B. As described herein, the second metal layer 108 may be integrally formed with the second via structure 106. The forming of the fourth metal layer 138 may be performed simultaneously with the forming of the second metal layer 108. The second via structure 106 in the first device region 140 may be formed to have the same height as the memory cell structure 136 in the second device region 142. A (CMP) step may be performed thereafter to planarize the upper surfaces of the second metal layer 108 and the fourth metal layer 138.

To form the embodiments shown in FIG. 1A and FIG. 2A, the conductive material may be deposited directly on the first via structure 104. Alternatively, to form the embodiments shown in FIG. 1B and FIG. 2B, at least one conductive barrier liner (not shown) may be deposited in the via opening 146 and the trenches 154 before the deposition of the conductive material.

Advantageously, the presence of the first via structure 104 may enable the formed via opening 146 to have substantially vertical sidewalls, as well as a larger width to height ratio.

A larger width to height ratio of the via opening 146 may enable a complete filling of materials to form the second via structure 106, and prevent the formation of undesirable voids within the second via structure 106. Accordingly, the present disclosure may provide improved electrical performance, increased reliability, and increased yield of an IC chip.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, non-volatile (NV) memory devices, FinFET transistor devices, CMOS devices, etc.

What is claimed is:

1. A semiconductor device comprising:
    a first device region comprising:
        a first metal layer;
        a first via structure over the first metal layer;
        a second via structure over the first via structure; and
        a second metal layer over the second via structure, wherein the first via structure and the second via structure electrically couple the second metal layer to the first metal layer, and the first via structure is shorter than the second via structure;
    a second device region comprising:
        a third metal layer;
        a contact structure over the third metal layer;
        a memory cell structure over the contact structure; and
        a fourth metal layer over the memory cell structure;

wherein the first via structure and the contact structure are made of the same material.

2. The device of claim 1, further comprising:
a dielectric region comprising the first metal layer and the third metal layer; and
a dielectric layer on the dielectric region, wherein the first via structure and the contact structure are formed in the dielectric layer.

3. The device of claim 2, wherein the second metal layer is substantially coplanar with the fourth metal layer.

4. The device of claim 3, wherein a separation distance between the second metal layer and the first metal layer is substantially the same as a separation distance between the third metal layer and the fourth metal layer.

5. The device of claim 4, further comprising a second dielectric region, wherein the the second via structure, the memory cell structure, the second metal layer, and the fourth metal layer are in the second dielectric region.

6. The device of claim 1, wherein the first device region comprises a logic region and the second device region comprises a memory region.

7. The device of claim 6, wherein the memory cell structure is configured as a resistive memory device.

8. The device of claim 6, wherein the memory cell structure is configured as a magneto-resistive random access memory (MRAM) device.

9. The device of claim 6, wherein the memory cell structure is configured as a ferro-electric random access memory (FeRAM) device.

10. The device of claim 1, wherein the first via structure and the contact structure have the same height.

11. The device of claim 1, wherein the second via structure is disposed directly on the first via structure.

12. The device of claim 11, wherein the first via structure is disposed directly on the first metal layer.

13. The device of claim 1, further comprising a conductive barrier liner between the first metal layer and the first via structure.

14. The device of claim 1, further comprising at least one conductive barrier liner between the second via structure and the first via structure.

15. The device of claim 1, further comprising:
a first conductive barrier liner between the first metal layer and the first via structure; and
second and third conductive barrier liners between the second via structure and the first via structure, wherein the second conductive barrier liner is disposed upon the first via structure and the third conductive barrier liner is disposed upon the second conductive barrier liner.

16. A method of forming a semiconductor device comprising:
forming a first metal layer and a third metal layer in a dielectric region, wherein the first metal layer is located in a first device region and the third metal layer is located in a second device region;
forming a dielectric layer on the dielectric region;
patterning openings in the dielectric layer;
filling the openings with a conductive material to form a first via structure over the first metal layer and a contact structure over the third metal layer;
forming a memory cell structure over the contact structure;
forming a second via structure over the first via structure and a second metal layer on the second via structure, wherein the first via structure and the second via structure electrically couple the second metal layer to the first metal layer, and the first via structure is shorter than the second via structure; and
forming a fourth metal layer over the memory cell structure.

17. The method of claim 16, further comprising forming a dielectric material over the first via structure and patterning the dielectric material before forming the second via structure.

18. The method of claim 17, wherein the patterning of the dielectric material defines a via opening and a trench in the dielectric material, the via opening is defined over the first via structure and the trench is defined over the via opening.

19. The method of claim 18, wherein the forming of the fourth metal layer is performed simultaneously with the forming of the second metal layer.

20. The method of claim 18, further comprising filling the via opening and the trench with a conductive material to form the second via structure and the second metal layer, wherein the second metal layer is integrally formed with the second via structure.

* * * * *